United States Patent
Wang et al.

(10) Patent No.: US 11,334,161 B2
(45) Date of Patent: May 17, 2022

(54) ELECTRONIC APPARATUS AND OPERATING METHOD THEREOF

(71) Applicant: BOE TECHNOLOGY GROUP CO., LTD., Beijing (CN)

(72) Inventors: Li Wang, Beijing (CN); Yonghong Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 502 days.

(21) Appl. No.: 16/346,296

(22) PCT Filed: Nov. 20, 2018

(86) PCT No.: PCT/CN2018/116361
§ 371 (c)(1),
(2) Date: Apr. 30, 2019

(87) PCT Pub. No.: WO2020/010774
PCT Pub. Date: Jan. 16, 2020

(65) Prior Publication Data
US 2021/0357030 A1    Nov. 18, 2021

(30) Foreign Application Priority Data
Jul. 12, 2018 (CN) .......................... 201810765441.9

(51) Int. Cl.
*G06F 3/01* (2006.01)
*G06F 3/041* (2006.01)
(Continued)

(52) U.S. Cl.
CPC .............. *G06F 3/016* (2013.01); *G06F 3/041* (2013.01); *G06F 2203/04102* (2013.01); *H01H 13/84* (2013.01); *H03K 17/962* (2013.01)

(58) Field of Classification Search
CPC ..................... G06F 3/016; G06F 3/041; G06F 2203/04102; H01H 13/84; H03K 17/962
See application file for complete search history.

(56) References Cited

U.S. PATENT DOCUMENTS 7,920,131 B2 * 4/2011 Westerman ............ H01H 13/84
345/173
2008/0019115 A1    1/2008 Park et al.
(Continued)

FOREIGN PATENT DOCUMENTS

CN       101520541 A    9/2009
CN       101599380 A    12/2009
(Continued)

OTHER PUBLICATIONS

International Search Report dated Feb. 12, 2019, issued in counterpart Application No. PCT/CN2018/116361 (10 pages).
(Continued)

*Primary Examiner* — Lixi C Simpson
(74) *Attorney, Agent, or Firm* — WHDA, LLP

(57) ABSTRACT

The disclosure relates to an electronic apparatus. The electronic apparatus may include a flexible panel comprising an operating side surface and a non-operating side surface. The operating side surface may include a touch operating area. The touch apparatus may include a plurality of raised units. The touch apparatus may be configured to form a plurality of raised operating portions corresponding to the plurality of raised units on a surface of the touch operating area.

12 Claims, 13 Drawing Sheets

(51) Int. Cl.
*H01H 13/84* (2006.01)
*H03K 17/96* (2006.01)

(56) References Cited

U.S. PATENT DOCUMENTS

| | | | |
|---|---|---|---|
| 2011/0304550 A1* | 12/2011 | Romera Jolliff | G06F 3/016 |
| | | | 345/168 |
| 2016/0011684 A1 | 1/2016 | Zhang | |
| 2019/0033923 A1* | 1/2019 | Wang | G06F 1/1662 |
| 2020/0004337 A1* | 1/2020 | Hendren | G06F 3/03547 |

FOREIGN PATENT DOCUMENTS

| | | |
|---|---|---|
| CN | 102064035 A | 5/2011 |
| CN | 102508585 A | 6/2012 |
| CN | 104428739 A | 3/2015 |
| CN | 104679416 A | 6/2015 |
| CN | 205318243 U | 6/2016 |
| CN | 106527728 A | 3/2017 |
| CN | 107229308 A | 10/2017 |
| CN | 206585604 U | 10/2017 |
| CN | 107704080 A | 2/2018 |
| CN | 107837180 A | 3/2018 |
| CN | 108519835 A | 9/2018 |
| CN | 108519852 A | 9/2018 |
| CN | 208092594 U | 11/2018 |
| WO | 2013/173624 A2 | 11/2013 |

OTHER PUBLICATIONS

Office Action dated Nov. 25, 2019, issued in counterpart CN Application No. 201810765441.9, with English translation (32 pages).

* cited by examiner

ELECTRONIC APPARATUS AND OPERATING METHOD THEREOF

CROSS-REFERENCE TO RELATED APPLICATIONS

This application claims benefit of the filing date of Chinese Patent Application No. 201810765441.9 filed on Jul. 12, 2018, the disclosure of which is hereby incorporated in its entirety by reference.

This disclosure relates to display technology, in particular, to an electronic apparatus and an operating method thereof.

BACKGROUND

At present, an input operation to an electronic apparatus is usually implemented by providing an external keyboard or a touch panel. In the case of the external keyboard, the main body of the external keyboard and the electronic apparatus are usually two independent parts. In operation, the two independent parts are connected by means of a plug-in, a USB interface, bluetooth, etc., and the user can directly input the electronic apparatus by pressing buttons of the external keyboard. In the case of the touch panel, the touch panel is usually integrated with the display panel of the electronic apparatus. The user can input the electronic apparatus by touching the keyboard pattern displayed on the display panel.

BRIEF SUMMARY

One example of the present disclosure provides an electronic apparatus. The electronic apparatus may include a flexible panel comprising an operating side surface and a non-operating side surface, the operating side surface comprising a touch operating area, and a touch apparatus comprising a plurality of raised units. The touch apparatus may be configured to form a plurality of raised operating portions corresponding to the plurality of raised units on a surface of the touch operating area.

Optionally, the touch apparatus further comprises a driving structure, which is configured to drive the plurality of raised units to generate displacement at least in a direction perpendicular to the flexible panel, thereby forming the plurality of raised operating portions.

Optionally, the driving structure comprises a plurality of rotating shafts, the plurality of raised units are disposed on the plurality of rotating shafts, and the plurality of rotating shafts are configured to drive the plurality of raised units to generate the displacement in the direction perpendicular to the flexible panel.

Optionally, the driving structure further comprises a first connecting rod, the first connecting rod is connected to the plurality of rotating shafts, and the first connecting rod is configured to simultaneously drive the plurality of rotating shafts to rotate, thereby driving the plurality of raised units to generate the displacement in the direction perpendicular to the flexible panel.

Optionally, the driving structure further comprises a plurality of first connecting rods. The plurality of first connecting rods are connected to the plurality of rotating shafts respectively, and the plurality of first connecting rods is configured to respectively drive the plurality of rotating shafts to rotate, thereby driving the plurality of raised units to generate the displacement in the direction perpendicular to the flexible panel.

Optionally, the driving structure further comprises a plurality of second connecting rods and a plurality of cam structures disposed on the plurality of second connecting rods. The plurality of cam structures is configured to act on the plurality of rotating shafts to drive the plurality of rotating shafts to generate the displacement in the direction perpendicular to the flexible panel.

Optionally, the driving structure further comprises a first frame. The first frame is disposed between the rotating shafts and the flexible panel, and the first frame has a plurality of openings that coincide with the plurality of raised units to allow the plurality of raised units to protrude from the plurality of openings.

Optionally, the driving structure comprises a first substrate, and the plurality of raised units is disposed on the first substrate. The first substrate is configured to drive the raised units to generate the displacement in the direction perpendicular to the flexible panel.

Optionally, the driving structure further comprises a shifting unit and a returning unit. The shifting unit is configured to drive the plurality of raised units to move toward the flexible panel at least in the direction perpendicular to the flexible panel. The returning unit is configured to drive the plurality of raised units to move away from the flexible panel at least in the direction perpendicular to the flexible panel.

Optionally, the shifting unit comprises a first magnet and a second magnet, and the first magnet is disposed between the adjacent raised units on the first substrate; and the second magnet is disposed at a position corresponding to the first magnet on the surface of the non-operating side surface of the flexible panel. The returning unit comprises a spring disposed between the first substrate and the flexible panel.

Optionally, the driving structure further comprises a second frame disposed between the first substrate and the flexible panel, and the second frame has a plurality of openings that coincide with the plurality of raised units to allow the plurality of raised units to protrude from the plurality of openings.

Optionally, the shifting unit comprises a first magnet and a second magnet, the first magnet is disposed between the adjacent raised units on the first substrate; the second magnet is disposed at the position corresponding to the first magnet on the surface of the second frame facing the plurality of raised units. The returning unit comprises a spring disposed between the first substrate and the second frame.

Optionally, the driving structure further comprises a second connecting rod and a plurality of cam structures disposed on the second connecting rod; and the cam structures are configured to act on the first substrate to drive the first substrate to generate the displacement in the direction perpendicular to the flexible panel.

Optionally, the electronic apparatus further comprises a control apparatus. The control apparatus is configured to control an operational state of the driving structure in accordance with a control signal.

Optionally, the flexible panel is a flexible display panel or a flexible touch panel.

Optionally, each of the plurality of raised units comprises a contact switch or a capacitive switch.

Another example of the present disclosure is an operating method of the electronic apparatus according to one embodiment of the present disclosure. The method may include driving the plurality of raised units to move toward the flexible panel to cause the raised units to raise the non-operating side surface of the flexible panel, thereby forming the plurality of raised operating portions corresponding to the plurality of raised units on the surface of the touch operating area of the flexible panel, or driving the plurality of raised units to move away from the flexible panel to restore the surface of the flexible panel to be flat.

BRIEF DESCRIPTION OF THE DRAWINGS

In order to more clearly illustrate the technical solutions of the embodiments of the present disclosure, the drawings of the embodiments will be briefly described below. It is apparent that the drawings in the following description relate only to some embodiments of the present disclosure, and are not intended to limit the disclosure.

DETAILED DESCRIPTION

Figure 1:
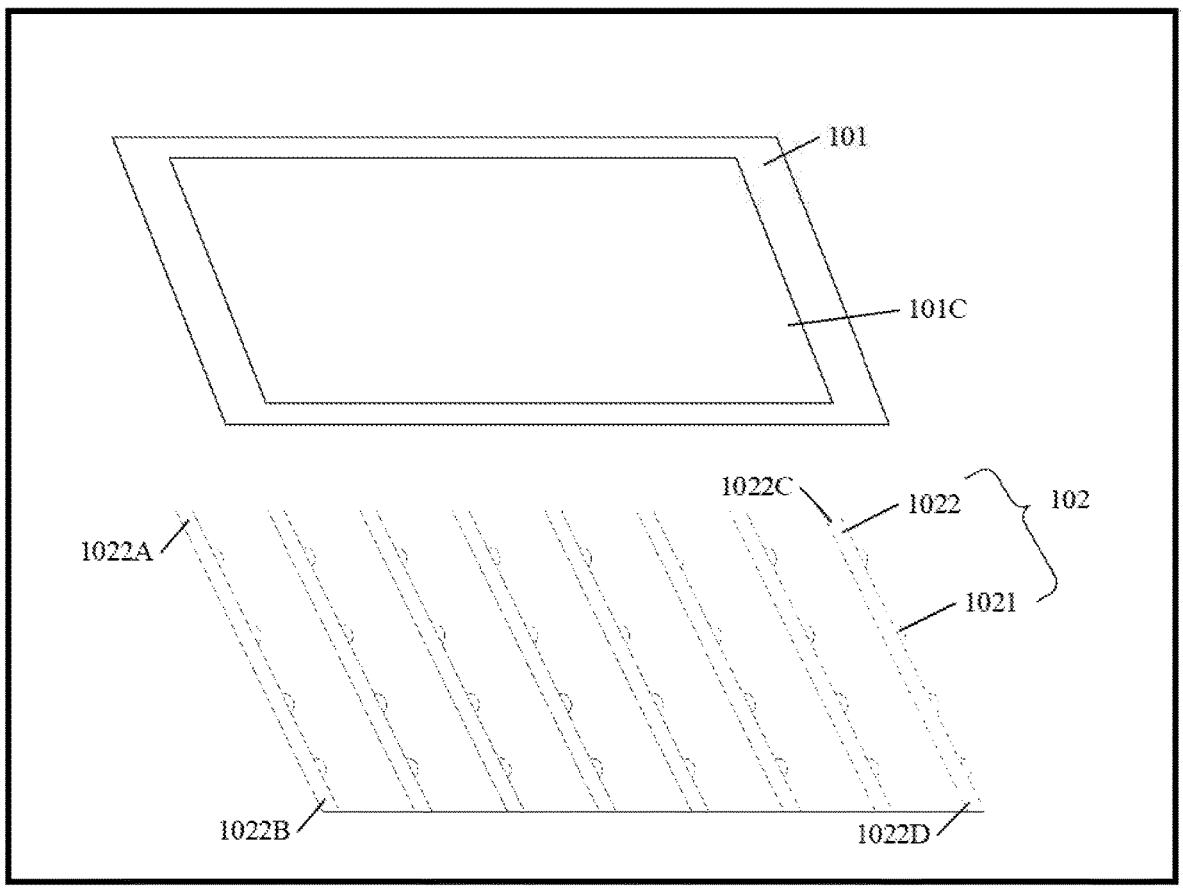
FIG. 1 is a schematic diagram of an unassembled structure of an electronic apparatus according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-10B. When referring to the figures, like structures and elements shown throughout are indicated with like reference numerals.

Unless otherwise defined, technical terms or scientific terms used in the present disclosure are intended to be understood in the ordinary meaning of those of ordinary skill in the art. The words "first," "second," and similar terms used in the present disclosure do not denote any order, quantity, or importance, but are used to distinguish different components. The words "including" or "comprising," and the like are intended to mean that the elements or items that appear before the words contain the elements or items that appear after the words and the equivalent, but not exclusive of other elements or items. "Connected" or "coupled" and the like are not limited to physical or mechanical connections, but may include electrical connections, whether direct or indirect. "Upper," "lower," "left," and "right," etc. are only used to indicate the relative positional relationship, and when the absolute position of the object to be described is changed, the relative positional relationship may also change accordingly.

In actual use, a user uses an external keyboard conveniently to input the electronic apparatus. As such, the user can have a better input experience. For example, "touch typing" can be realized, that is, typing without looking at the keyboard. However, the external keyboard is an independent peripheral, which takes up a large space and is not conducive to miniaturization and portable design of the electronic apparatus. Although the touch electronic apparatus can integrate the touch panel with the display panel, the user can only perform the input operation by touching the flat graphic keyboard displayed on the display panel. When the input operation is performed, the user sometimes cannot accurately locate the positions of the graphic keyboard displayed on the display panel. Thus, input errors often occur due to inaccurate positioning. As such, the user's input experience is not ideal. For example, although the input errors can be improved by increasing compression shock and auxiliary sound, the effect of these methods is still not satisfactory, and the user still hopes that the input position can be accurately located by the familiar manner of touch typing.

Accordingly, one example of the present disclosure provides an electronic apparatus including a flexible panel and a touch apparatus. The flexible panel includes an operating side surface and a non-operating side surface. The operating side surface includes a touch operating area. The touch apparatus includes a plurality of raised units. The touch apparatus is configured to enable the plurality of raised units to raise the non-operating side surface of the flexible panel. Accordingly, a plurality of raised operating portions corresponding to the plurality of raised units is formed on the surface of the touch operating area. These raised operating portions formed on the surface of the touch operating area, for example, can assist the user in accurately locating the positions of the input by tactile sensation, thereby providing an operating experience similar to an external keyboard while also contributing to miniaturization of the electronic apparatus and portable design.

The electronic apparatus of the present disclosure and its operating method will be described below through several specific embodiments.

Figure 2A:
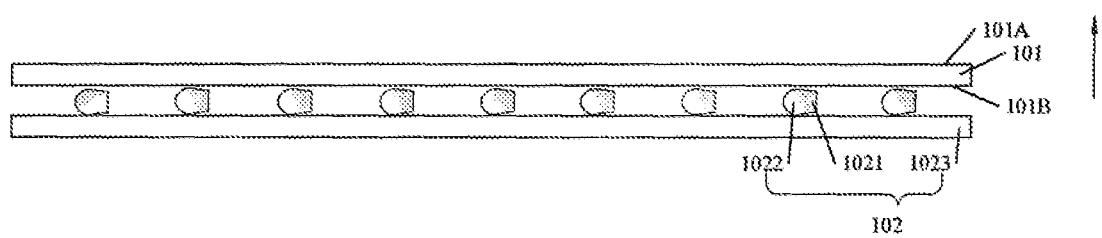
FIG. 2A is a schematic diagram showing the electronic apparatus of FIG. 1 in an initial state.
Figure 2B:
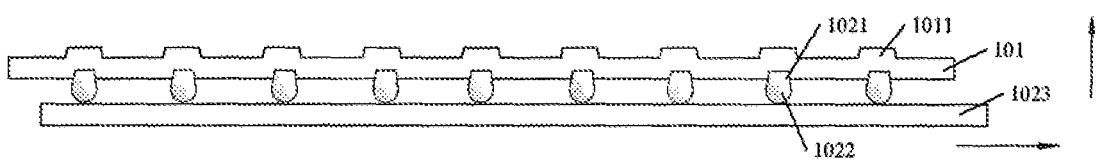
FIG. 2B is a schematic diagram of the electronic apparatus of FIG. 1 in a keyboard state.

At least one embodiment of the present disclosure provides an electronic apparatus including a flexible panel 101 and a touch apparatus 102, as shown in FIGS. 1, 2A, and 2B.

The flexible panel 101 includes an operating side surface 101A and a non-operating side surface 101B, and the operating side surface 101A includes a touch operating area 101C. For example, the touch operating area 101C may be a part of the operating side surface 101A of the flexible panel 101. In one embodiment, the touch operating area 101C is located at a center position of the operating side surface 101A in FIG. 1. In other embodiments, the touch operating area 101C may also be located at a certain edge position of the operating side surface 101A. The specific position of the touch operating area 101C is not limited in this embodiment.

The touch apparatus 102 includes a plurality of raised units 1021. In one embodiment, the positions of the plurality of raised units 1021 are arranged to correspond to the position of the touch operating area 101C. The touch apparatus 102 is configured to enable the plurality of raised units 1021 to raise the non-operating side surface 101B of the flexible panel 101. As a result, a plurality of raised operating portions 1011 corresponding to the plurality of raised units 1021 is formed on the surface of the touch operating area 101C.

In one embodiment, the touch apparatus may further include, for example, a driving structure, which is configured to drive the raised units 1021 to generate displacement at least in a direction perpendicular to the flexible panel 101 (as indicated by vertical snows in FIGS. 2A and 2B). As a result, a plurality of raised operating portions 1011 corresponding to the plurality of raised units 1021 is formed on the surface of the touch operating area 101C.

In one embodiment, as shown in FIG. 1, the driving structure includes a plurality of rotating shafts 1022. A plurality of raised units 1021 is disposed on the plurality of rotating shafts 1022, for example, on the surface of the plurality of rotating shafts 1022 or embedded in the plurality of rotating shafts 1022. In one embodiment, one rotating shaft 1022 is provided with one or a plurality of raised units 1021 uniformly disposed thereon (as shown in the figure). In one embodiment, the raised units 1021 on the adjacent rotating shafts 1022 can be aligned (as shown in the figure) or misaligned. The embodiments of the present disclosure do not limit the manner in which the raised units 1021 are disposed on the rotating shaft 1022. In one embodiment, the manner in which the raised units 1021 are disposed on the rotating shafts 1022 may be similar to a preset type of keyboard to be formed. The raised units 1021 can move in a direction perpendicular to the flexible panel 101 by the rotation of the rotating shafts 1022.

In one embodiment, as shown in FIGS. 2A and 2B, the raised units 1021 are driven to move in a direction perpendicular to the flexible panel 101 by the rotation of the rotating shaft 1022. In one embodiment, as shown in FIG. 2A, the electronic apparatus is at an initial state (first state), in which the flexible panel 101 of the electronic apparatus is in a planar mode. As such, the flexible panel 101 has a touch function, and the user can perform touch operation such as sliding, gesture, and the like on the flexible panel 101. The raised units 1021 are located on the sides of the rotating shafts 1022, for example, in a plane parallel to the surface of the flexible display panel between adjacent rotating shafts 1022. As such, the raised units 1021 do not exert force on the flexible panel 101, and the surface of the flexible panel 101 remains flat. When the rotating shafts 1022 are rotated, the raised units 1021 are gradually turned to the flexible panel 101. As shown in FIG. 2B, the raised units 1021 can finally raise the non-operating side surface 101B of the flexible panel 101 and exert force on the flexible panel 101. As a result, a plurality of raised operating portions 1011 corresponding to the plurality of raised units 1021 is formed on the surface of the touch operating area 101C. As such, the electronic apparatus is in an active state (second state), in which the flexible panel of the electronic apparatus is in a keyboard mode. In one embodiment, a keyboard image is displayed in the display area of the flexible display panel having the touch function, and the keys in the keyboard image are in one-to-one correspondence with the plurality of raised operating portions 1011. Therefore, the user can perform inputting operations such as inputting of numbers and characters by means of these "raised" keyboard keys. The keyboard thus formed can be any type of keyboard, such as a QWERTY keyboard, as needed.

In this embodiment, the flexible panel 101 can be a flexible display panel or a flexible touch panel. For example, the flexible display panel can be an organic light emitting diode (OLED) display panel. Correspondingly, the flexible display panel with the touch function can be an On-Cell type OLED touch display panel, or an In-Cell type OLED touch display panel. The touch structure may be a type of resistive, capacitive, photoelectric, or the like.

In one example, the flexible panel 101 is a flexible touch panel such as a flexible touch display panel, and the electronic apparatus is in the keyboard mode. The operator can perceive the positions for inputting through the raised operating portions 1011 on the flexible panel 101. As such, an input operation is realized by touching the raised operating portions 1011, thereby making the input operation more accurate and convenient.

In one embodiment, the flexible panel 101 is a flexible display panel such as a flexible non-touch display panel, and the electronic apparatus is in the keyboard mode. The operator can perceive the positions for inputting through the raised operating portions 1011 on the flexible panel 101, and the input operation is realized by pressing the raised operating portion 1011 (i.e., the manner of pressing the button). In one embodiment, a contact switch is included inside the raised unit 1021, and pressing the raised operating portion 1011 can turn on the contact switch in the raised unit 1021, thereby realizing an input operation. Alternatively, a capacitive switch is included inside the raised unit 1021. Pressing the raised operating portion 1011 can change the distance between the switch electrodes to generate a change in capacitance, so that the capacitive switch is turned on, thereby implementing an input operation. When the external force of the pressing is removed, the contact switch or the capacitive switch of the raised unit returns to a non-input state.

Figure 2C:
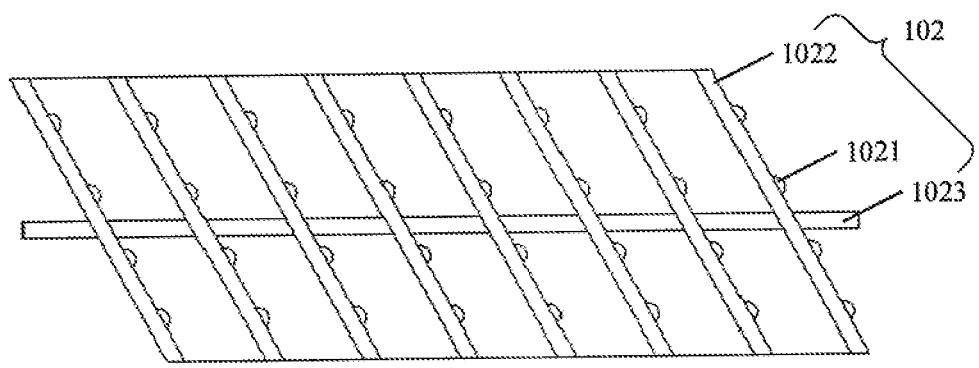
FIG. 2C is a schematic diagram of a touch apparatus according to one embodiment of the present disclosure.

In one embodiment, as shown in FIG. 2C, the driving structure may further include a first connecting rod 1023, and the first connecting rod 1023 is simultaneously connected to the middle points of the plurality of rotating shafts 1022 respectively. Therefore, the first connecting rod 1023 can simultaneously drive the plurality of rotating shafts 1022 to rotate. As such, the first connecting rod 1023 can simultaneously drive the plurality of raised units 1021 to move or generate displacement in a direction perpendicular to the flexible panel 101.

In one embodiment, as shown in FIG. 2C, the respective contacting surfaces between the first connecting rod 1023 and the rotating shaft 1022 may have a matching partial rack and pinion combination structure, so that the rotating shafts 1022 can be driven to rotate by pulling the first connecting rod 1023. For example, as shown in FIG. 2B, the first connecting rod 1023 can be reciprocally pulled in the direction indicated by the lateral arrow to realize the reciprocal rotation of the rotating shafts 1022. As such, the flexible panel can be switched between the planar mode and the keyboard mode.

In one embodiment, the driving structure may include a first connecting rod that is simultaneously connected to the end faces of the plurality of rotating shafts. The first connecting rod can simultaneously rotate the plurality of rotating shafts, so that the first connecting rod can simultaneously drive the plurality of raised units to move in a direction perpendicular to the flexible panel.

Figure 2D:
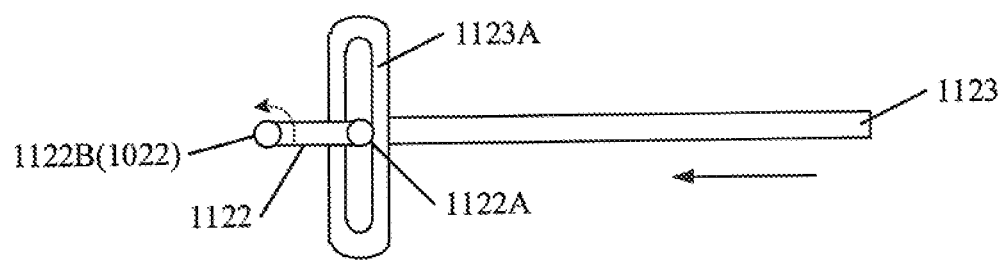
FIG. 2D and FIG. 2E are schematic diagrams of a driving structure according to one embodiment of the present disclosure.
Figure 2E:
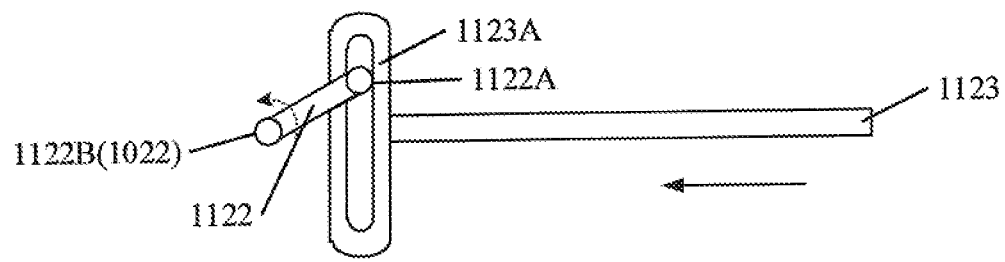

In one embodiment, as shown in FIG. 2D and FIG. 2E, the end faces of the first connecting rod 1123 and the rotating shaft 1022 respectively have a matching guide rail 1123A and a strip slider 1122. The first end 1122A of the strip slider 1122 is configured to be able to slide along the guide rail 1123A so that the second end 1122B of the strip slider 1122 can be rotated. For example, the first connecting rod 1123 is reciprocally pulled in the direction indicated by the lateral arrow. At this time, the first end 1122A of the strip slider 1122 can be circularly moved along the guide rail 1123A with the second end 1122B of the strip slider 1122 as a center, so that the second end 1122B can be rotated. In one embodiment, the second end 1122B can be fixedly coupled to the end face of the rotating shaft 1022, so that the rotating shaft can be rotated by pulling the first connecting rod 1123.

In one embodiment, FIG. 2E is a diagram showing that the first end 1122A of the strip slider 1122 rotates counterclockwise at a certain angle along the guide rail 1123A with the second end 1122B of the strip slider 1122 as a center by pushing the first connecting rod 1123 of FIG. 2D to the left. In the process, the first end 1122A of the strip slider 1122 causes the shaft 1022 to also rotate accordingly. For example, as shown in FIG. 2D and FIG. 2E, only the case where the first connecting rod 1123 has one slide rail 1123A is shown. In fact, the first connecting rod 1123 may have a plurality of slide rails 1123A. Correspondingly, the strip sliders 1122 are respectively connected to the plurality of rotating shafts 1022, so that the first connecting rod 1123 can simultaneously drive the plurality of rotating shafts 1022 to rotate.

In one embodiment, the driving structure may include a plurality of first connecting rod respectively connected to one or more rotating shafts, so that one or more rotating shafts may be respectively driven to rotate. As such, the plurality of first connecting rods can drive respectively a plurality of raised units to move in a direction perpendicular to the flexible panel.

Figure 2F:
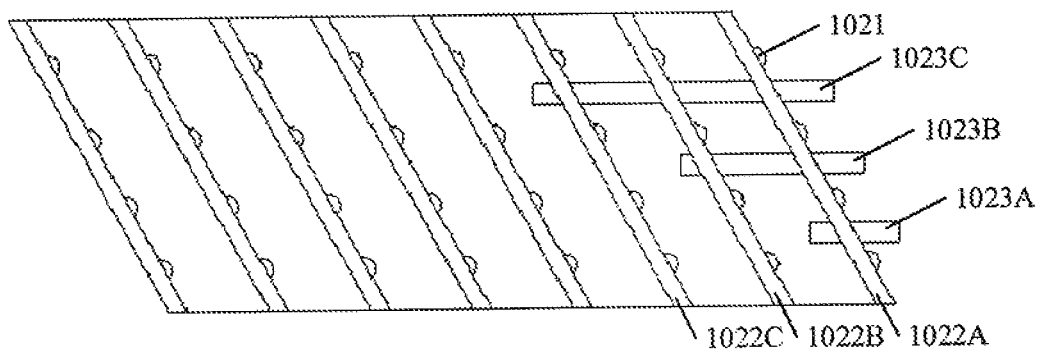
FIG. 2F is a schematic diagram of a touch apparatus according to one embodiment of the present disclosure.

In one embodiment, three first connecting rods, namely 1023A, 1023B, and 1023C, are shown in FIG. 2F, and the three first connecting rods 1023A, 1023B, and 1023C are coupled to three rotating shafts 1022A, 1022B, and 1022C, respectively. As such, each first connecting rod can drive a rotating shaft to realize separate control of multiple rotating shafts. It should be noted that for the sake of clarity, only three first connecting rods are shown in FIG. 2F. In fact, the other shafts are also respectively connected with other first connecting rods.

Figure 3A:
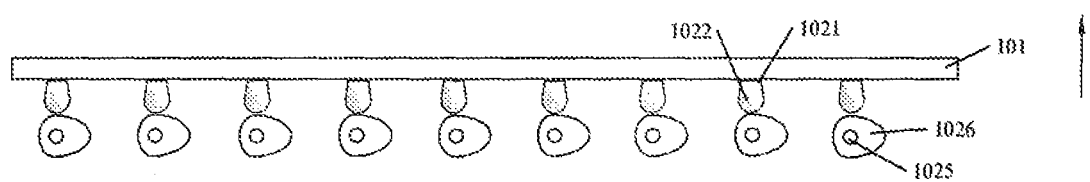
FIG. 3A is a schematic diagram of the electronic apparatus of FIG. 1 in an initial state.
Figure 3B:
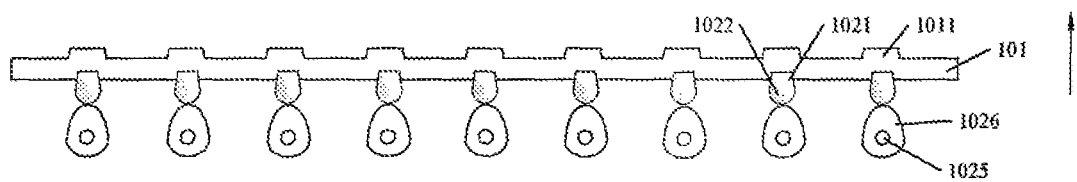
FIG. 3B is a schematic diagram of the electronic apparatus of FIG. 1 in a keyboard state.

In one embodiment, in addition to using the first connecting rod to rotate the plurality of rotating shafts to drive the raised units to move, as shown in FIGS. 3A and 3B, the driving structure may further include second connecting rods 1025 and a plurality of cam structures 1026 disposed on the second connecting rods 1025. FIGS. 3A and 3B show a cross-sectional view of the second connecting rods 1025, which extend in the same direction as the rotating shafts. The cam structure 1026 is configured to act on the plurality of rotating shafts to drive the plurality of rotating shafts 1022 to move or generate displacement in a direction perpendicular to the flexible panel 101 as indicated by the vertical arrows in the FIGS. 3A and 3B.

In one embodiment, as shown in FIG. 3A, the electronic apparatus is in an initial state. The protruding ends of the cam structures 1026 are located on the side of the second connecting rods 1025, for example, in the plane parallel to the surface of the flexible display panel between the two adjacent connecting rods 1025. As such, the cam structures 1026 do not exert force on the rotating shafts 1022. Accordingly, the surface of the flexible panel 101 remains flat, and the flexible panel of the electronic apparatus is in a planar mode. When the second connecting rods 1025 are rotated such that the second connecting rods 1025 drive the cam structures 1026 to rotate, the protruding ends of the cam structures 1026 gradually turn to the rotating shaft 1022. As shown in FIG. 3B, the cam structures 1026 can finally raise the rotating shafts 1022. As such, the plurality of raised units 1021 raise the non-operating side surface 101B of the flexible panel 101, and exert force on the flexible panel 101. As a result, the plurality of raised operating portions 1011 corresponding to the plurality of raised units 1021 are formed on the surface of the touch operating area 101C, and the electronic apparatus is in the keyboard state. When the keyboard state is not required, the second connecting rods 1025 are continuously rotated to rotate the protruding ends of the cam structures 1026 to the side of the second connecting rods 1025, so that the cam structures 1026 no longer exert force on the rotating shaft 1022. In one embodiment, the rotating shafts 1022 return to the initial position under the action of its own gravity, so that the surface of the flexible panel 101 is restored flat, and the electronic apparatus returns to the planar mode.

In one embodiment, each of the rotating shafts 1022 is controlled by a second connecting rod 1025 (i.e., as shown in FIGS. 3A and 3B). Each of the second connecting rods 1025 can have two cam structures 1026. The two cam structures may be disposed at both ends of the second connecting rod 1025. For example, the two cam structures may be disposed at the positions of both ends 1022A and 1022B of the rotating shaft 1022 shown in FIG. 1, so that one second connecting rod 1025 may wholly raise a rotating shaft 1022.

In one embodiment, the plurality of rotating shafts 1022 can also be simultaneously controlled by a pair of second connecting rods 1025, that is, two second connecting rods 1025. At this time, the plurality of rotating shafts 1022 are fixedly coupled to a frame, and the cam structures 1026 may be disposed, for example, at the positions corresponding to the four corners 1022A, 1022B, 1022C, and 1022D of the frame illustrated in FIG. 1. As such, the pair of second rods 1025 may wholly raise a plurality of rotating shafts 1022.

Figure 4:
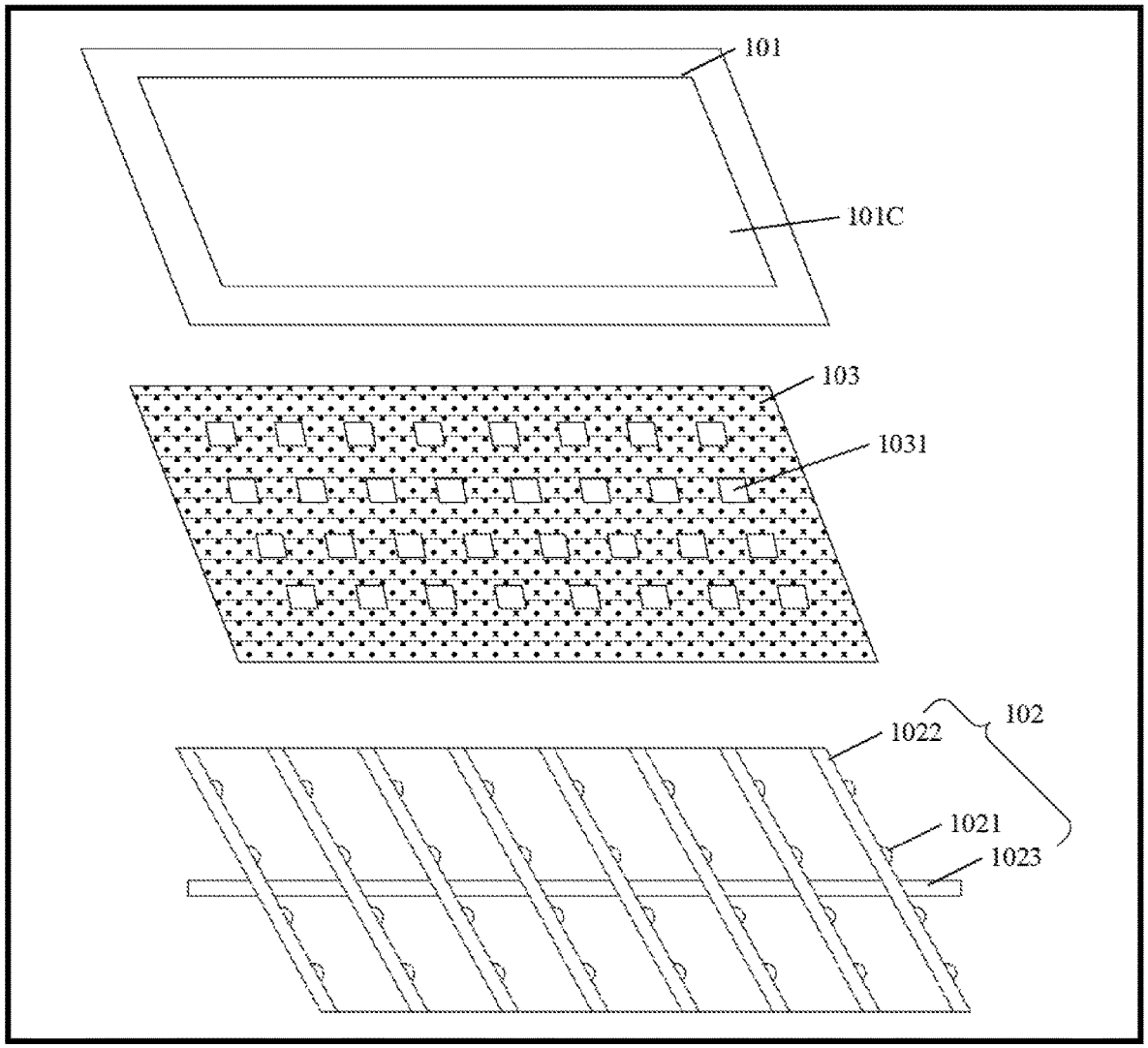
FIG. 4 is a schematic diagram of an unassembled structure of an electronic apparatus according to one embodiment of the present disclosure.

In one embodiment, as shown in FIG. 4, the driving structure may further include a first frame 103. The first frame 103 is disposed between the plurality of rotating shafts 1022 and the flexible panel 101. The first frame 103 has a plurality of openings 1031 that allow the plurality of raised units 1021 to protrude from the plurality of openings 1031.

Figure 5A:
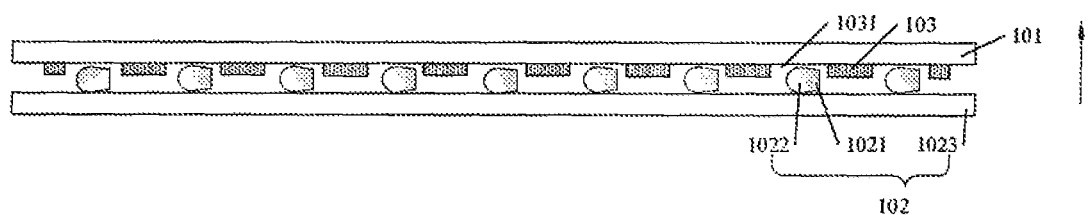
FIG. 5A is a schematic diagram of the electronic apparatus of FIG. 4 in an initial state.
Figure 5B:
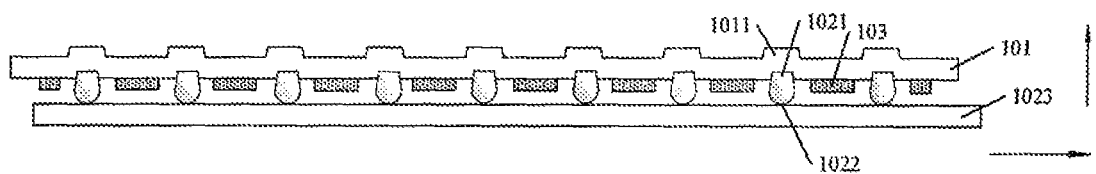
FIG. 5B is a schematic diagram of the electronic apparatus of FIG. 4 in a keyboard state.

In one embodiment, as shown in FIGS. 5A and 5B, the driving structure includes the first frame 103. The plurality of raised units 1021 may protrude in the space defined by the plurality of openings 1031 driven by the plurality of rotating shafts 1022 and raise the non-operating side surface 101B of the flexible panel 101. At this time, the first frame 103 can function to support and protect the flexible display panel 101, to define the raised position of the raised units 1021, and to prevent the lateral displacement of the raised units 1021.

Figure 6:
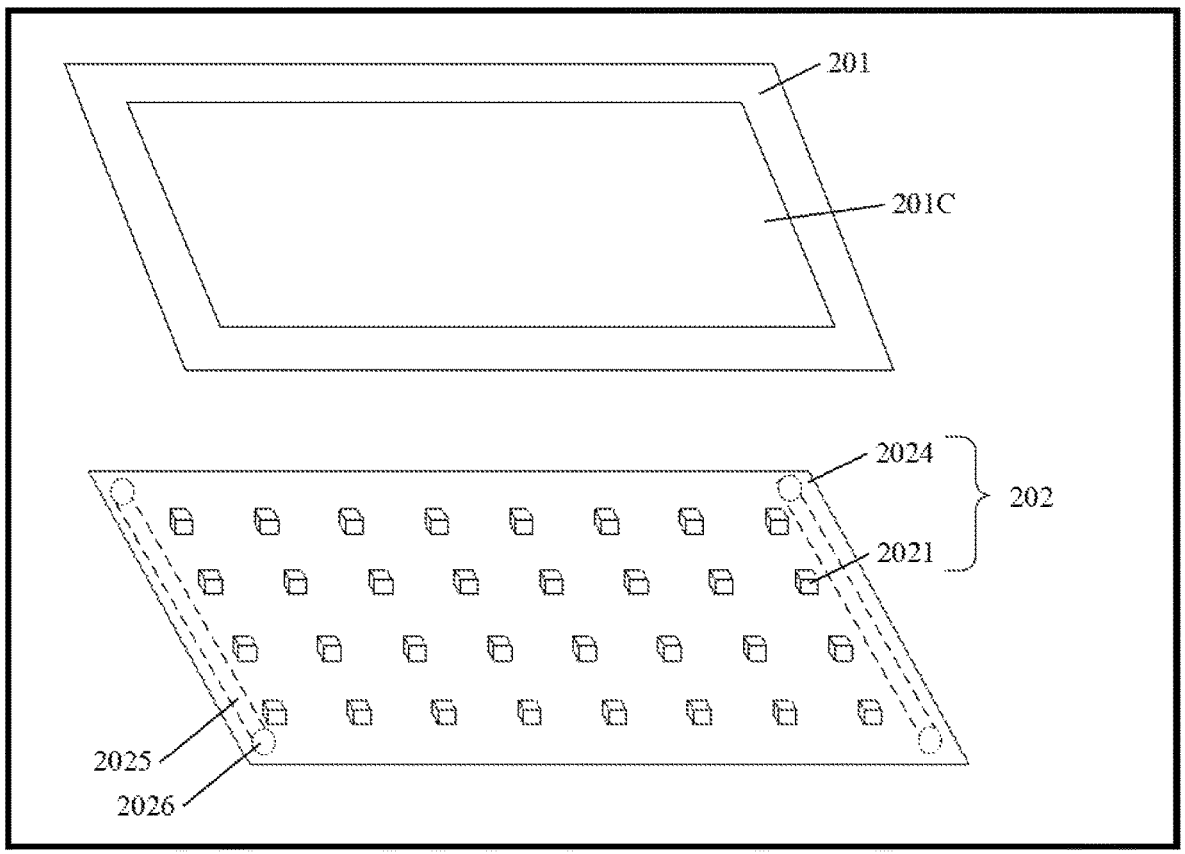
FIG. 6 is a schematic diagram of an unassembled structure of an electronic apparatus according to one embodiment of the present disclosure.
Figure 7A:
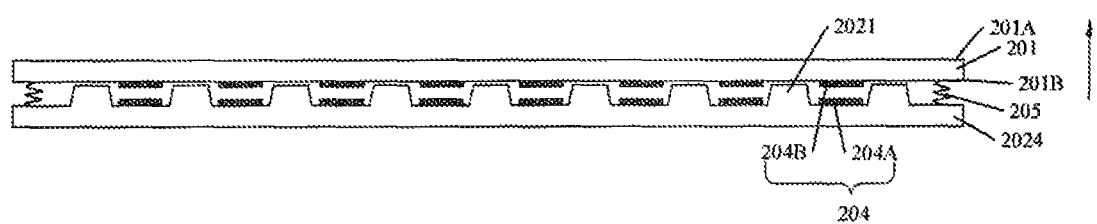
FIG. 7A is a schematic diagram of the electronic apparatus of FIG. 6 in an initial state.
Figure 7B:
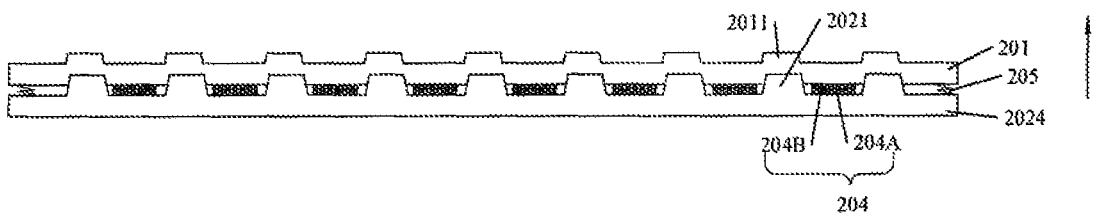
FIG. 7B is a schematic diagram of the electronic apparatus of FIG. 6 in a keyboard state.

At least one embodiment of the present disclosure provides an electronic apparatus including a flexible panel 201 and a touch apparatus 202, as shown in FIGS. 6, 7A, and 7B. The flexible panel 201 includes an operating side surface 201A and a non-operating side surface 201B. The operating side surface 201A includes a touch operating area 201C. The touch apparatus 202 includes a plurality of raised units 2021, and the set positions of the plurality of raised units 2021 correspond to the position of the touch operating area 201C. The touch apparatus 202 is configured such that the plurality of raised units 2021 can raise the non-operating side surface 201B of the flexible panel 201, thereby forming the plurality of raised operating portions 2011 corresponding to the plurality of raised units 2021 on the surface of the touch operating area 201C.

In one embodiment, the touch apparatus may further include a driving structure configured to drive the raised unit 2021 to move or generate displacement at least in a direction perpendicular to the flexible panel 201.

In one embodiment, as shown in FIG. 6, the driving structure may include, for example, a first substrate 2024. A plurality of raised units 2021 is disposed on the first substrate 2024. The plurality of raised units 2021 may be uniformly disposed in an array on the first substrate 2024 (as shown in the figure), or the plurality of raised units 2021 may be patterned on the first substrate 2024 according to specific needs. The raised units 2021 can move or generate displacement in a direction perpendicular to the flexible panel 201 driven by the first substrate 2024, so that the plurality of raised units 2021 can raise the non-operating side surface 201B of the flexible panel 201. As such, a plurality of raised operating portions 2011 corresponding to the plurality of raised units 2021 is formed on the surface of the touch operating area 201C.

In one embodiment, the driving structure may include a shifting unit and a returning unit. The shifting unit is configured to drive the plurality of raised units 2021 to generate displacement toward the flexible panel 201 at least in a direction perpendicular to the flexible panel 201. The returning unit is configured to drive the plurality of raised units 2021 to generate displacement away from the flexible panel 201 at least in a direction perpendicular to the flexible panel 201. In the embodiment, the shifting unit and the returning unit can be implemented in different ways.

In one embodiment, as shown in FIGS. 7A and 7B, the shifting unit 204 may include a first magnet 204A and a second magnet 204B. The first magnet 204A is disposed between the adjacent raised units 2021 on the first substrate 2024. The second magnet 204B is disposed at a position corresponding to the first magnet 204A on the surface of the non-operating side surface 201B of the flexible panel 201. In one embodiment, the returning unit 205 includes a spring or springs disposed between the first substrate 2024 and the flexible panel 201. For example, there may be a plurality of springs between the first substrate 2024 and the flexible panel 201, and the plurality of springs may be disposed at edge positions corresponding to the four sides of the first substrate 2024 and the flexible panel 201. In one embodiment, a plurality of springs may be disposed at positions corresponding to the four corners of the first substrate 2024 and the flexible panel 201.

In one embodiment, one of the first magnet 204A and the second magnet 204B is an electromagnet, and the other is made of a magnetic material which can be magnetized. The operating state of the shifting unit 204 can be controlled by electrically powering on or off the first magnets 204A or the second magnets 204B, which are the electromagnets. For example, as shown in FIG. 7A, in the initial state of the electronic apparatus, the first magnets 204A and the second magnets 204B are in a power-off state. As such, the first magnets 204A and the second magnets 204B do not generate an attractive force, and the returning unit 205, such as a spring, is in a relaxed state. Accordingly, the first substrate 2024 and the flexible panel 201 can be kept at a certain distance, the raised units 2021 do not protrude from the flexible panel 201, and the surface of the flexible panel 201 remains flat.

In one embodiment, as shown in FIG. 7B, after the electromagnets of the first magnets 204A or the second magnets 204B are electrically powered on, the first magnets 204A and the second magnets 204B are attracted to each other to be bonded together, at which time the returning unit 205, such as the spring, is in a compressed state. As such, the plurality of raised units 2021 raise the non-operating side surface 201B of the flexible panel 201, and exert force on the flexible panel 201, thereby forming a plurality of raised operating portions 2011 corresponding to the plurality of raised units 2021 on the surface of the touch operating area 201C. As a result, the electronic apparatus is in the keyboard state. When the first magnets 204A and the second magnets 204B are powered off, the first magnets 204A and the second magnets 204B are no longer attracted to each other, and the returning unit 205 returns to restore the first substrate 2024 and the flexible panel 201 to be at an interval from each other. The flexible panel 201 restores the flat surface.

Figure 8A:
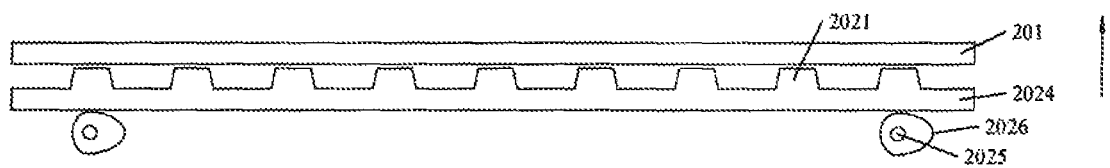
FIG. 8A is a schematic diagram of the electronic apparatus of FIG. 6 in an initial state.
Figure 8B:
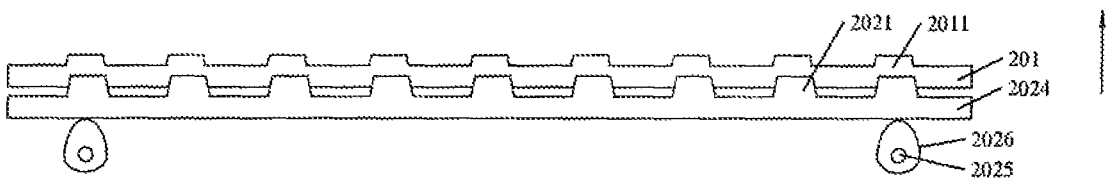
FIG. 8B is a schematic diagram of the electronic apparatus of FIG. 6 in a keyboard state.

In one embodiment, in addition to using the shifting unit and the returning unit to cause displacement of the raised units, as shown in FIGS. 8A and 8B, the driving structure may further include a second connecting rod 2025 (a cross-sectional view of the second connecting rod shown in the figures) and a plurality of cam structures 2026 disposed on the second connecting rod 2025. The cam structures 2026 are configured to act on the first substrate 2024 to drive the first substrate 2024 to move in a direction perpendicular to the flexible panel 201 (the direction indicated by the vertical arrow in the figure).

In one embodiment, as shown in FIGS. 8A and 8B, the driving structure includes two second connecting rod 2025, and each of the second connecting rods 2025 is provided with two cam structures 2026. For example, the two second connecting rods 2025 are respectively disposed on two sides of the first substrate 2024, and the cam structures 2026 are respectively disposed at positions corresponding to the four corners of the first substrate 2024 at the two ends of the second connecting rods 2025. In one embodiment, the broken line rods in FIG. 6 respectively show the positions at which the second connecting rods 2025 and the cam structures 2026 are correspondingly disposed.

In one embodiment, the number of the second connecting rods 2025 and the number of the cam structures 2026 disposed on the second connecting rods 2025 can be adjusted as needed, which is not limited in the embodiments of the present disclosure. In one embodiment, in the case where the electronic apparatus is in an initial planar mode, the protruding ends of the cam structures 2026 are located at the side of the second connecting rods 2025, so that the cam structures 2026 do not exert force on the first substrate 2024, and the surface of the flexible panel 201 remains flat. When the second connecting rods 2025 are rotated such that the second connecting rods 2025 drive the cam structures 2026 to rotate, the protruding ends of the cam structures 2026 gradually turn to the first substrate 2024. As shown in FIG. 8B, the cam structures 2026 can finally raise the first substrate 2024, so that the plurality of raised units 2021 raise the non-operating side surface 201B of the flexible panel 201, and exert force on the flexible panel 201, thereby forming a plurality of raised operating portions 2011 corresponding to the raised units 2021 on the surface of the touch operating area 201C. Accordingly, the electronic apparatus is in the keyboard mode. When the keyboard mode is not required, the second connecting rods 2025 are continuously rotated to rotate the protruding ends of the cam structures 2026 to the side of the second connecting rods 2025, so that the cam structures 2026 no longer exert force on the first substrate 2024. As such, the substrate 2024 can be returned to the initial position, for example, by its own gravity. Accordingly, the surface of the flexible panel 201 is restored flat, and the electronic apparatus returns to the planar mode.

In one embodiment, the second connecting rods 2025 and the cam structures 2026 constitute, for example, a shifting unit for raising the first substrate 2024. For this purpose, for example, a returning unit (not shown in the figure) may be further provided to assist the first substrate 2024 to restore. In one embodiment, a compression spring is disposed between the flexible panel 201 and the first substrate 2024 for pushing the first substrate 2024 backward. In one embodiment, a tension spring is disposed on a side of the first substrate 2024 opposite from the flexible panel 201 for pulling the first substrate 2024 backward.

Figure 9:
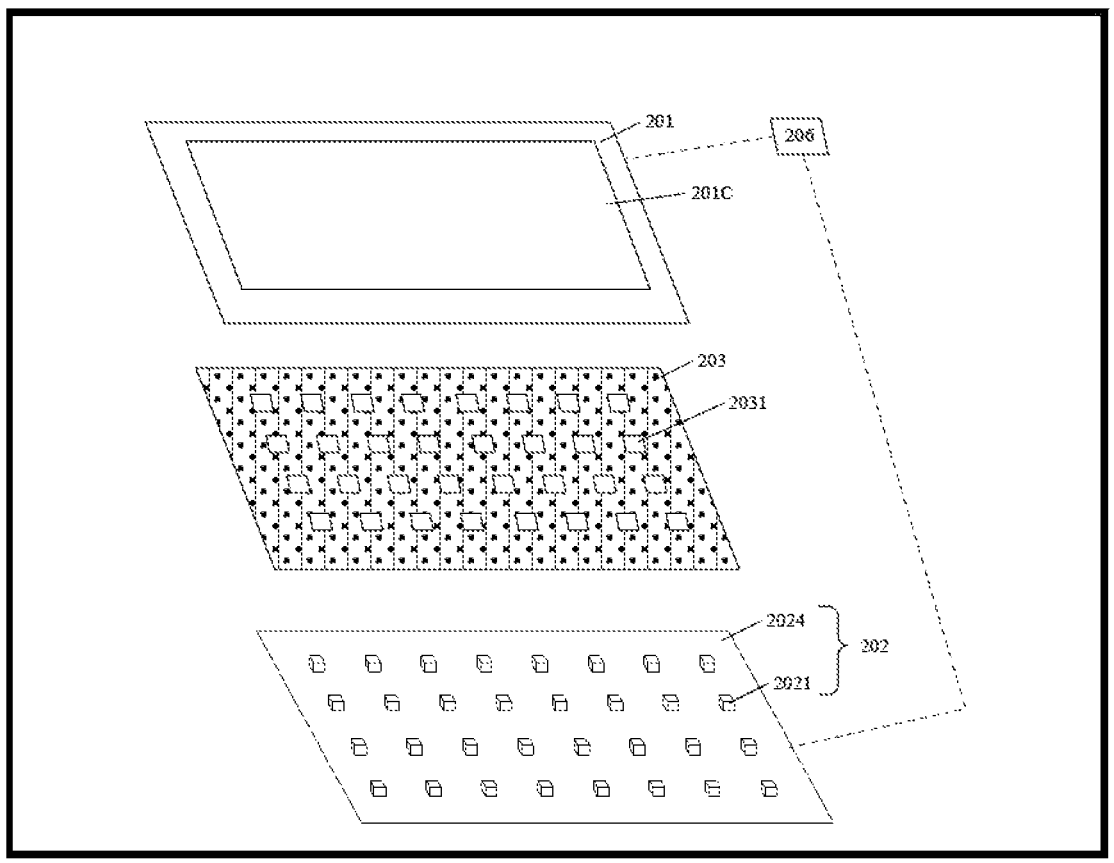
FIG. 9 is a schematic diagram of an unassembled structure of an electronic apparatus according to one embodiment of the present disclosure.

In one embodiment, as shown in FIG. 9, the driving structure may further include a second frame 203 disposed between the first substrate 2024 and the flexible panel 201. The second frame 203 has a plurality of openings 2031 coinciding with the plurality of raised units to allow the plurality of raised units 2021 to protrude from the plurality of openings 2031. At this time, the plurality of raised units 2021 may protrude in the space defined by the plurality of openings 2031 and raise the non-operating side surface 201B of the flexible panel 201. In this embodiment, the first frame 203 can function to support and protect the flexible display panel 201, to define the protruding positions of the raised units 2021, and to prevent the lateral displacement of the raised units 2021.

Figure 10A:
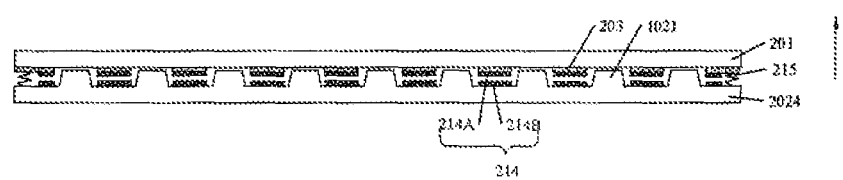
FIG. 10A is a schematic diagram of the electronic apparatus of FIG. 9 in an initial state.
Figure 10B:
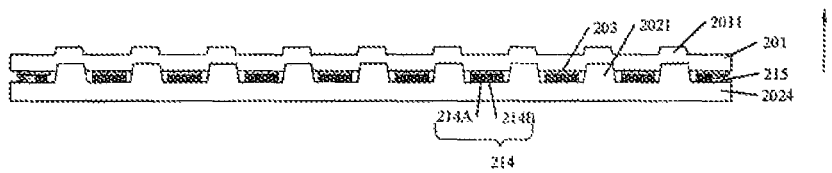
FIG. 10B is a schematic diagram of the electronic apparatus of FIG. 9 in a keyboard state.

In one embodiment, as shown in FIGS. 10A and 10B, in the case where the driving structure includes the second frame 203, the shifting unit 214 and the returning unit 215 may be employed to drive the first substrate 2024 to move in a direction perpendicular to the flexible panel 201.

In one embodiment, for the first magnets 214A and the second magnets 214B included in the shifting unit 214, the first magnets 214A are disposed between adjacent raised units 2021 on the first substrate 2024 respectively. The second magnets 214B are disposed at the positions corresponding to the first magnets 214A on the surface of the second frame 203 facing the raised units 2021. The returning unit 215 includes a spring or springs disposed between the first substrate 2024 and the second frame 203. In one embodiment there is a plurality of springs between the first substrate 2024 and the second frame 203, and the plurality of springs may be disposed at edge positions corresponding to the four sides of the first substrate 2024 and the second frame 203. In one embodiment, a plurality of springs may be disposed at positions corresponding to the four corners of the first substrate 2024 and the second frame 203. At this time, the operating process of the shifting unit 214 and the returning unit 215 is the same as that of the above example, and the details are not described herein again.

In one embodiment, as shown in FIG. 9, the electronic apparatus may further include, for example, a control apparatus 206 configured to control an operating mode of the driving structure according to a control signal.

In one embodiment, the control apparatus 206 can send signals to the driving structure in a wired or wireless manner to control operating mode of the driving structure. In one embodiment, the control apparatus 206 can control the driving structure according to a control signal input by an operator or according to a control signal preset in the electronic apparatus, thereby implementing switching between the initial state of the electronic apparatus and the keyboard state.

In one embodiment, as shown in FIGS. 10A and 10B, the flexible panel 201 is a flexible display panel. The control apparatus 206 may control whether the first magnets 214A and the second magnets 214B are powered on or off based on the display mode of the flexible panel 201, for example, based on whether there is an input box in the display panel or whether an input operation is required. As such, the raised units 2021 are controlled to move or generate displacement. In one embodiment, the control apparatus 206 can be in the form of a central processing unit (CPU), a single chip microcomputer, or a programmable logic controller (PLC), etc., which is not limited in the embodiments. In one embodiment, the control apparatus 206 can include a processing circuit and a memory apparatus, which can be a magnetic memory apparatus or a semiconductor memory apparatus for storing operational instructions or data, and the like. In one embodiment, the flexible panel and the touch apparatus can share the same control apparatus 206 and/or other components, such as a power source, a memory, and the like.

At least one embodiment of the present disclosure also provides a method of operating an electronic apparatus including a flexible panel and a touch apparatus as described above. The flexible panel includes an operating side surface and a non-operating side surface. The operating side surface includes a touch operating area. The touch apparatus includes a plurality of raised units, which face a non-operating side surface of the flexible panel. The touch apparatus is configured to enable the plurality of raised unit to raise the non-operating side surface of the flexible panel, thereby forming raised operating portions corresponding to the plurality of raised units on the surface of the touch operating area. Corresponding to the electronic apparatus, the operating method includes: driving the raised units to move toward the flexible panel to cause the raised units to raise the surface of the flexible panel and to form a plurality of raised operating portions corresponding to the plurality of raised units on the surface of the touch operating area of the flexible panel. As such, the flexible panel assumes a keyboard state. The operating method further includes driving raised units to move away from the flexible panel to restore the surface of the flexible panel flat, such that the flexible panel assumes an initial state.

In one embodiment, when the flexible panel assumes the keyboard state, the operator can sense the input position through the raised operating portions on the flexible panel, and realize the input operation by touching or pressing the raised operating portions, etc. As such, the input operation is more accurate and convenient.

The drawings of the present disclosure relate only to the structures mentioned in the embodiments of the present disclosure, and other structures can refer to the general design.

For the sake of clarity, in the drawings for describing embodiments of the present disclosure, the thickness of layers or areas can be enlarged or reduced. That is, the drawings are not drawn to actual scales. It will be understood that when an element such as a layer, a film, an area or a substrate is referred to as being "on" or "under" another element, the former element is "directly" "on" or "under" the another element, or there may be intermediate elements.

In the case of no conflict, the embodiments of the present disclosure and the features in the embodiments may be combined with each other to obtain a new embodiment.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. An electronic apparatus, comprising:
    a flexible panel comprising an operating side surface and a non-operating side surface, the operating side surface comprising a touch operating area; and
    a touch apparatus comprising a plurality of raised units;
    wherein the touch apparatus is configured to form a plurality of raised operating portions corresponding to the plurality of raised units on a surface of the touch operating area;
    the touch apparatus further comprises a driving structure, which is configured to drive the plurality of raised units to generate displacement at least in a direction perpendicular to the flexible panel, thereby forming the plurality of raised operating portions; and
    the driving structure comprises a plurality of rotating shafts, the plurality of raised units are disposed on the plurality of rotating shafts, and the plurality of rotating shafts are configured to drive the plurality of raised units to generate the displacement in the direction perpendicular to the flexible panel.

2. The electronic apparatus according to claim 1, wherein the driving structure further comprises a first connecting rod, the first connecting rod is connected to the plurality of rotating shafts, and the first connecting rod is configured to simultaneously drive the plurality of rotating shafts to rotate, thereby driving the plurality of raised units to generate the displacement in the direction perpendicular to the flexible panel.

3. The electronic apparatus according to claim 1, wherein the driving structure further comprises a plurality of first connecting rods;
    the plurality of first connecting rods are connected to the plurality of rotating shafts respectively, and the plurality of first connecting rods is configured to respectively drive the plurality of rotating shafts to rotate, thereby driving the plurality of raised units to generate the displacement in the direction perpendicular to the flexible panel.

4. The electronic apparatus according to claim 1, wherein the driving structure further comprises a plurality of second connecting rods and a plurality of cam structures disposed on the plurality of second connecting rods,
    the plurality of cam structures is configured to act on the plurality of rotating shafts to drive the plurality of rotating shafts to generate the displacement in the direction perpendicular to the flexible panel.

5. The electronic apparatus according to claim 1, wherein the driving structure further comprises a first frame, the first frame is disposed between the rotating shafts and the flexible panel, and the first frame has a plurality of openings that coincide with the plurality of raised units to allow the plurality of raised units to protrude from the plurality of openings.

6. The electronic apparatus according to claim 1, further comprising a control apparatus,
    wherein the control apparatus is configured to control an operational state of
    the driving structure in accordance with a control signal.

7. The electronic apparatus according to claim 1, wherein the flexible panel is a flexible display panel or a flexible touch panel.

8. The electronic apparatus according to claim 1, wherein each of the plurality of raised units comprises a contact switch or a capacitive switch.

9. An operating method of the electronic apparatus of claim 1, comprising:
    driving the plurality of raised units to move toward the flexible panel to cause the raised units to raise the non-operating side surface of the flexible panel, thereby forming the plurality of raised operating portions corresponding to the plurality of raised units on the surface of the touch operating area of the flexible panel; or
    driving the plurality of raised units to move away from the flexible panel to restore the surface of the flexible panel to be flat.

10. An electronic apparatus, comprising:
    a flexible panel comprising an operating side surface and a non-operating side surface, the operating side surface comprising a touch operating area; and
    a touch apparatus comprising a plurality of raised units;
    wherein the touch apparatus is configured to form a plurality of raised operating portions corresponding to the plurality of raised units on a surface of the touch operating area;
    the touch apparatus further comprises a driving structure, which is configured to drive the plurality of raised units to generate displacement at least in a direction perpendicular to the flexible panel, thereby forming the plurality of raised operating portions;
    the driving structure comprises a first substrate, and the plurality of raised units are disposed on the first substrate; the first substrate is configured to drive the raised units to generate the displacement in the direction perpendicular to the flexible panel;
    the driving structure further comprises a shifting unit and a returning unit,
    the shifting unit is configured to drive the plurality of raised units to move toward the flexible panel at least in the direction perpendicular to the flexible panel; and
    the returning unit is configured to drive the plurality of raised units to move away from the flexible panel at least in the direction perpendicular to the flexible panel;
    the shifting unit comprises a first magnet and a second magnet, and the first magnet is disposed between the adjacent raised units on the first substrate; and the second magnet is disposed at a position corresponding to the first magnet on the surface of the non-operating side surface of the flexible panel; and
    the returning unit comprises a spring disposed between the first substrate and the flexible panel.

11. The electronic apparatus according to claim 10, wherein the driving structure further comprises a second connecting rod and a plurality of cam structures disposed on the second connecting rod; and the cam structures are configured to act on the first substrate to drive the first substrate to generate the displacement in the direction perpendicular to the flexible panel.

12. An electronic apparatus, comprising:
a flexible panel comprising an operating side surface and a non-operating side surface, the operating side surface comprising a touch operating area; and
a touch apparatus comprising a plurality of raised units;
wherein the touch apparatus is configured to form a plurality of raised operating portions corresponding to the plurality of raised units on a surface of the touch operating area;
the touch apparatus further comprises a driving structure, which is configured to drive the plurality of raised units to generate displacement at least in a direction perpendicular to the flexible panel, thereby forming the plurality of raised operating portions;
the driving structure comprises a first substrate, and the plurality of raised units are disposed on the first substrate; the first substrate is configured to drive the raised units to generate the displacement in the direction perpendicular to the flexible panel;
the driving structure further comprises a shifting unit and a returning unit,
the shifting unit is configured to drive the plurality of raised units to move toward the flexible panel at least in the direction perpendicular to the flexible panel;
the returning unit is configured to drive the plurality of raised units to move away from the flexible panel at least in the direction perpendicular to the flexible panel;
the driving structure further comprises a second frame disposed between the first substrate and the flexible panel, and the second frame has a plurality of openings that coincide with the plurality of raised units to allow the plurality of raised units to protrude from the plurality of openings;
the shifting unit comprises a first magnet and a second magnet, the first magnet is disposed between the adjacent raised units on the first substrate; the second magnet is disposed at the position corresponding to the first magnet on the surface of the second frame facing the plurality of raised units; and
the returning unit comprises a spring disposed between the first substrate and the second frame.

* * * * *